(12) United States Patent
Harada

(10) Patent No.: US 6,793,116 B2
(45) Date of Patent: Sep. 21, 2004

(54) SOLDER BALL AND INTERCONNECTION STRUCTURE USING THE SAME

(75) Inventor: Tomoko Harada, Kumamoto (JP)

(73) Assignee: NEC Electronics Corporation, Kanagawa (JP)

( * ) Notice: Subject to any disclaimer, the term of this patent is extended or adjusted under 35 U.S.C. 154(b) by 176 days.

(21) Appl. No.: 10/255,373

(22) Filed: Sep. 26, 2002

(65) Prior Publication Data

US 2003/0060066 A1 Mar. 27, 2003

(30) Foreign Application Priority Data

Sep. 27, 2001 (JP) ........................................ 2001-295701

(51) Int. Cl.[7] .............................. B23K 35/14; B23K 5/22
(52) U.S. Cl. ................................. 228/56.3; 228/180.22
(58) Field of Search ........................... 228/56.3, 180.22; 257/737, 738; 438/613

(56) References Cited

U.S. PATENT DOCUMENTS

| | | | | |
|---|---|---|---|---|
| 3,778,530 A | * | 12/1973 | Reimann | ..................... 174/261 |
| 4,758,988 A | * | 7/1988 | Kuo | ....................... 365/185.09 |
| 5,143,273 A | * | 9/1992 | Topel et al. | ................ 228/56.3 |

\* cited by examiner

Primary Examiner—Tom Dunn
Assistant Examiner—Colleen P. Cooke
(74) Attorney, Agent, or Firm—Choate, Hall & Stewart

(57) ABSTRACT

A solder ball achieves a desired quantity of solder material for a solder joint easily without increasing the thickness of a solder layer formed to cover a core. The solder ball comprises a conductive core having depressions on its outer surface, and a solder layer formed to cover the outer surface of the core in such a way as to fill the depressions of the core. Thus, the quantity of the solder material included in the ball is supplemented by the solder material filled into the depressions. Preferably, the core has a higher melting point than the solder layer and wettability to the solder layer. The core may have a cavity in its inside, thereby forming a shell-shaped core. The core may be made of a porous metal body having pores, in which part of the pores reaches the outer surface of the core, thereby forming the depressions.

20 Claims, 5 Drawing Sheets

SOLDER BALL AND INTERCONNECTION STRUCTURE USING THE SAME

BACKGROUND OF THE INVENTION

1. Field of the Invention

The present invention relates generally to the interconnection techniques of electronic components or devices (e.g., surface mount components and/or devices) or functional modules with conductive joints. More particularly, the invention relates to a solder ball used for mechanical and electrical interconnection between opposing electrodes of electronic components/devices, functional modules, and substrates, and an interconnection structure with conductive joints formed by the solder balls.

2. Description of the Related Art

When electronic components/devices and/or various types of functional modules (all of which may be referred simply "electronic components/devices" hereinafter) are mounted on a substrate such as a Printed Wiring Board (PWB) with solder balls, the height of conductive joints formed by solder balls needs to be as uniform as possible over the whole surface of the substrate. However, this is difficult for conventional solder balls to be satisfied. This is because conventional solder balls are formed by simply shaping a solder material into spherical bodies and therefore, they are likely to be deformed in their melting and solidifying processes (i.e., their reflowing process).

Moreover, the operation tests for the electronic components/devices, which are carried out before mounting the components/devices on the substrate, are usually conducted after the formation of solder bumps on the bonding pads of the components/devices by melting the solder balls and solidifying them. In these tests, electrical interconnection between the testing apparatus and the components/devices in question is usually achieved by contacting the connecting pins of the testing socket with the solder bumps on the components/devices with a specific pressing force. Additionally, since the operation tests are conducted for each of the components/devices with different testing apparatuses, pressing force is repeatedly applied to the solder bumps on the components/device. Accordingly, with the conventional solder balls, the solder bumps fixed onto the components/devices are likely to be deformed with the pressing force applied repeatedly during the tests and as a result, defective electrical interconnection tends to occur between the pins and the opposing bumps.

To overcome this problem, an improved solder ball has been developed and actually used. The improved solder ball comprises a metal core and a solder layer covering the outer surface of the core. The core is made of metal having a higher melting point than the solder material of the solder layer.

When mounting an electronic component/device on a substrate with the improved solder balls, first, the solder layers covering the metal cores of the solder balls are melted and solidified, thereby forming ball-shaped solder bumps on the corresponding pad or electrode of the component/device. The bumps are fixed to the opposing pads with the solder layers. Next, the component/device is aligned to the substrate in such a way that the bumps thus formed on the component/device contact the corresponding bonding pads or electrodes on the substrate. Thereafter, the component/device and the substrate are heated for a while to selectively melt only the solder layers of the bumps and then, they are cooled to solidify the solder layers thus melted. As a result, the solder layers thus solidified are fixed to the corresponding pads on the component/device and the opposing pads on the substrate while holding the metal cores within the corresponding solder bumps.

In this way, conductive solder joints are formed by the solder layers and their metal cores, thereby mechanically and electrically interconnecting the pads on the component/device with the corresponding pads on the substrate. Thus, the component/device is surface-mounted on the substrate and electrically connected thereto.

As explained above, with the prior-art improved solder balls, the height of the conductive solder joints can be kept substantially uniform over the whole surface of the substrate by the metal cores. Moreover, the cores enhance the mechanical strength of the solder bumps themselves. Therefore, defective electrical interconnection occurring in the operation tests can be avoided.

Generally, if the interconnection structure formed by using solder balls is applied to electronic equipment (e.g., computer systems) where the mounting or packaging density of electronic components/devices is becoming higher and higher, the dimension (i.e., the diameter) of solder balls must be decreased as the interval and/or width of the bonding pads become smaller.

With the prior-art improved solder ball having a metal core therein, to realize or obtain a desired quantity of solder material (i.e., a desired volume of the solder layer) with a small solder ball, the ratio of the thickness of the solder layer to the diameter of the metal core needs to be larger. In this case, however, the thickness of the solder layer tends to be non-uniform, in other words, the volume of the solder layer tends to fluctuate. Thus, there is a problem that a desired quantity of solder material is not obtainable stably.

If the thickness of the solder layer is decreased according to the diameter of the metal core, the thickness of the solder layer will be approximately uniform, thereby suppressing the fluctuation of the volume of the solder material. In this case, however, the volume of the solder layer decreases. This means that a desired quantity of solder material is not obtainable. As a result, a sufficient interconnection strength of the solder joint is not obtained as desired, because the adhesion strength of the solder layer to the bonding pad or electrode is insufficient. This leads to degradation or deterioration of mechanical and electrical interconnection reliability of the solder joint.

SUMMARY OF THE INVENTION

Accordingly, an object of the present invention is to provide a solder ball that achieves a desired quantity of solder material for a solder joint easily without increasing the thickness of a solder layer formed to cover a core.

Another object of the present invention is to provide a solder ball that achieves a desired quantity of solder material for a solder joint stably even if a solder ball is smaller.

Still another object of the present invention is to provide a solder ball that enhances the adhesion strength of a solder layer to a core thereof.

A further object of the present invention is to provide an interconnection structure using solder balls that ensures the mechanical and electrical interconnection reliability of solder joints as desired even if electronic components/devices are mounted on a substrate or an electronic component/device at a higher mounting or packaging density.

The above objects together with others not specifically mentioned will become clear to those skilled in the art from the following description.

According to a first aspect of the invention, a solder ball is provided, which comprises:

a conductive core having depressions on its outer surface; and a solder layer formed to cover the outer surface of the core in such a way as to fill the depressions of the core.

With the solder ball according to the first aspect of the invention, the conductive core has the depressions on its outer surface and the solder layer is formed to cover the outer surface of the core in such a way as to fill the depressions of the core. Therefore, the volume of the solder layer is larger than that of the above-described prior-art improved solder ball without depressions on the core by the total volume of the depressions. In other words, the quantity of the solder material included in the ball is supplemented by the solder material filled into the depressions. Accordingly, even if the thickness of the solder layer is not increased, a desired quantity of solder material for a solder joint is obtainable easily.

Moreover, since the thickness of the solder layer can be decreased according to the total volume of the depressions, the solder layer will be formed uniformly. This means that the volume of the solder layer is restrained from fluctuating. Thus, a desired quantity of solder material for a solder joint is obtainable stably even if the solder ball is made smaller.

Furthermore, part of the solder layer is filled into the depressions of the core and therefore, the adhesion strength of the solder layer to the core is enhanced compared with the above-described prior-art improved solder ball without depressions on the core.

In a preferred embodiment of the solder ball according to the first aspect of the invention, the core has a higher melting point than the solder layer. The core has wettability to the solder layer. In this embodiment, there is an additional advantage that the outer surface of the core is easily covered with and adhered to the solder layer.

In another preferred embodiment of the solder ball according to the first aspect of the invention, the core has a cavity in its inside. In this embodiment, there is an additional advantage that the weight of the solder ball is reduced, in other words, a lightweight solder ball can be realized. It is preferred that the depressions do not reach the cavity. Preferably, the core is shell-shaped by the cavity.

In a still another preferred embodiment of the solder ball according to the first aspect of the invention, the core and the cavity are spherical and concentric with each other. The core is shell-shaped.

In a further preferred embodiment of the solder ball according to the first aspect of the invention, the depressions are directed from the outer surface of the core to approximately a center thereof.

In a still further preferred embodiment of the solder ball according to the first aspect of the invention, each of the depressions has a depth larger than a diameter of a mouth thereof.

In a still further preferred embodiment of the solder ball according to the first aspect of the invention, the core has a cavity in its inside, and each of the depressions has a depth smaller than a diameter of a mouth thereof.

In still further preferred embodiment of the solder ball according to the first aspect of the invention, the core is made of a porous metal body having pores. Part of the pores reaches the outer surface of the core, forming the depressions. In this embodiment, there is an additional advantage that the solder ball is fabricated easily, because the process of forming the depressions of the core is eliminated.

According to a second aspect of the invention, an interconnection structure using solder balls is provided, which is designed for mechanically and electrically interconnecting a first electrode formed on a first member with an opposing second electrode formed on a second member with a conductive joint. The joint is formed by melting and solidifying the solder ball according to the first aspect of the invention. Specifically, the solder ball comprises a conductive core having depressions on its outer surface, and a solder layer formed to cover the outer surface of the core in such a way as to fill the depressions of the core.

With the interconnection structure according to the second first aspect of the invention, the joint is formed by melting and solidifying the solder ball according to the first aspect of the invention. Therefore, because of the same reason as described for the solder ball according to the first aspect of the invention, even if the dimension of the solder ball is reduced, a desired quantity of solder material for the joint is obtainable easily.

Thus, even if the dimension of the solder ball is reduced, the adhesion strength of the solder layer to the first and second electrodes will not be insufficient. This means that sufficient adhesion strength is obtainable as desired. As a result, the mechanical and electrical interconnection reliability of the joint is ensured as desired even if electronic components/devices are mounted on a substrate at a higher mounting or packaging density.

In a preferred embodiment of the structure according to the second aspect of the invention, the core of the solder ball has a higher melting point than the solder layer. The core has wettability to the solder layer.

In another preferred embodiment of the structure according to the second aspect of the invention, the core has a cavity in its inside. In this embodiment, it is preferred that the depressions do not reach the cavity. Preferably, the core is shell-shaped.

In a still another preferred embodiment of the structure according to the second aspect of the invention, the core and the cavity are spherical and concentric with each other. The core is shell-shaped.

In a further preferred embodiment of the structure according to the second aspect of the invention, the depressions are directed from the outer surface of the core to approximately a center thereof.

In a still further preferred embodiment of the structure according to the second aspect of the invention, each of the depressions has a depth larger than a diameter of a mouth thereof.

In a still further preferred embodiment of the structure according to the second aspect of the invention, the core has a cavity in its inside, and each of the depressions has a depth smaller than a diameter of a mouth thereof.

In still another preferred embodiment of the structure according to the second aspect of the invention, the core is made of a porous metal body having pores. Part of the pores reaches the outer surface of the core, forming the depressions.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
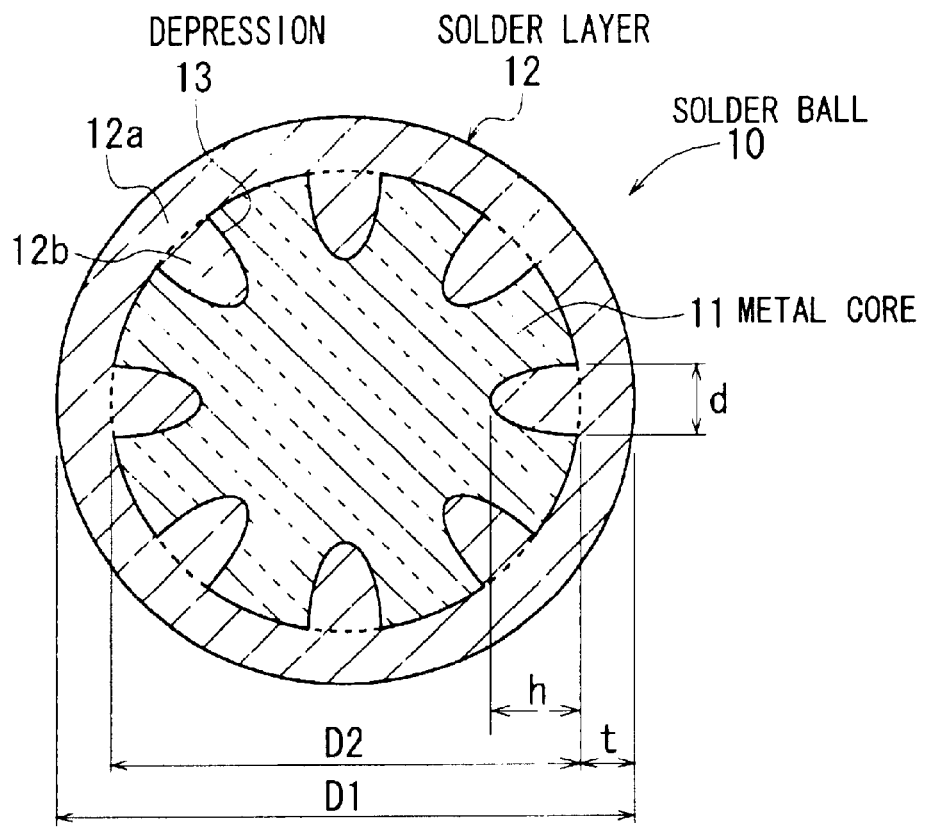
FIG. 1 is a schematic cross-sectional view showing the configuration of a solder ball according to a first embodiment of the invention, in which the core is solid.

Preferred embodiments of the present invention will be described in detail below while referring to the drawings attached.

First Embodiment

FIG. 1 shows the configuration of a solder ball 10 according to a first embodiment of the invention.

As shown in FIG. 1, the solder ball 10 of the first embodiment comprises a conductive metal core 11 with an approximately spherical shape and a solder layer 12 formed on the outer surface of the core 11. The core 11 is solid. The layer 12 covers the whole outer surface of the core 11.

Figure 2:
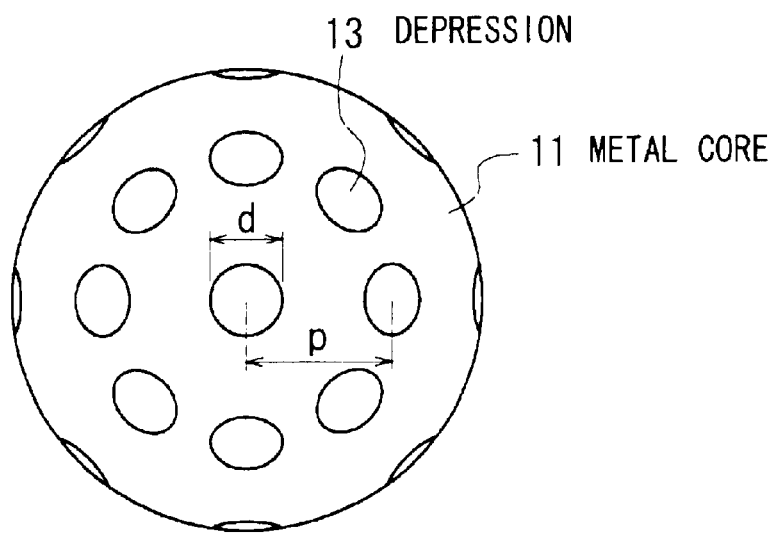
FIG. 2 is a schematic front view of the core used in the solder ball according to the first embodiment of FIG. 1.

FIG. 2 shows the external state of the metal core 11, in which the solder layer 12 is eliminated. As seen from FIGS. 1 and 2, the core 11 has depressions or concavities 13 on its outer surface. Each or these depressions 13 has a contour or profile obtained by cutting an ellipsoid (which is obtained by rotating an ellipse around its major axis) by a plane which contains its minor axis and which is perpendicular to its major axis. In other words, the contour of each of the depressions 13 is like a half of the ellipsoid. Each depression 13 has an approximately circular opening or mouth on the outer surface of the core 11.

The mouth diameter d, the depth h, and the pitch p of the depressions 13 are determined in such a way that a desired quantity of solder material is supplied to a solder joint. This will be explained later. In the first embodiment, the mouth diameter d is set at approximately 20 $\mu$m, the depth h is set at approximately 40 $\mu$m, and the pitch p is set at approximately 40 $\mu$m. Thus, the depth h is larger than the mouth diameter d in the first embodiment (i.e., h>d).

The material of the core 11 is a metal having a higher melting point than the solder material of the solder layer 12 and a wettability to the same solder material. Thus, the solder layer 12 can be melted by heat without melting the core 11 and at the same time, the whole outer surface of the core 11 can be easily covered with the layer 12.

As the material of the core 11, for example, copper (Cu), nickel (Ni), iron (Fe), chromium (Cr), tungsten (W) or the like may be used. A copper-based alloy such as a copper-nickel alloy may be used for this purpose. In the first embodiment, copper or copper-based alloy is used for the material of the core 11.

The solder layer 12 covers or wraps the whole outer surface of the core 11 in such a way that the solder material of the layer 12 is filled into all the depressions 13. Therefore, the layer 12 is formed by a spherical shell part 12a and filling parts 12b placed in the respective depressions 13. All the parts 12b are integrated with the shell part 12a. The thickness t of the layer 12 is determined in such a way that the shell part 12a is formed over the whole outer surface of the core 11 approximately uniformly.

As the solder material of the solder layer 12, for example, tin (Sn)-lead (Pb) system solder, bismuth (Bi)-tin (Sn) system solder, or the like may be used.

The diameter D1 of the solder ball 10 is determined according to the dimension and pitch of the bonding pad of a mounting subject. According to the diameter D1 thus determined, the diameter D2 of the metal core 11 and the thickness t of the solder layer 12 are determined.

Here, the solder quantity required for mounting electronic components/devices is defined as V, the volume of the shell part 12a of the layer 12 (which is determined by the diameter D2 and the thickness t) is defined as V1, and the total volume of the filling parts 12b of the layer 12 is defined as V2. Then, the volume V2 is determined to satisfy the following equation (1).

$$V2 = V - V1 \quad (1)$$

The mouth diameter d, the depth h, and the pitch p of the depressions 13 are set in such a way that the total capacity of the depressions 13 is equal to the volume V2 thus determined. Therefore, the sum of the volumes V1 and V2, (V1+V2), is equal to the desired or required solder quantity V.

The metal core 11 may be fabricated by various methods. If the core 11 is made of Cu or Cu-based alloy, for example, a known casting method is preferably used. The solder layer 11 may be fabricated by a known plating method or the like.

Next, a method of mounting an electronic component/device on a Printed Wiring Board (PWB) using the solder balls 10 according to the first embodiment is explained below with reference to FIGS. 3A to 3D and FIGS. 4A and 4B. FIGS. 3A to 3D show the process steps of this mounting method. FIGS. 4A and 4B show the states of the solder bump and the solder joint and their neighborhoods, respectively.

Here, for the sake of simplification of description, an electronic component 1 with bonding pads or electrodes 2 arranged on its surface is mounted on a PWB 4 with bonding pads or electrodes 5 arranged on its surface.

Figure 3A:
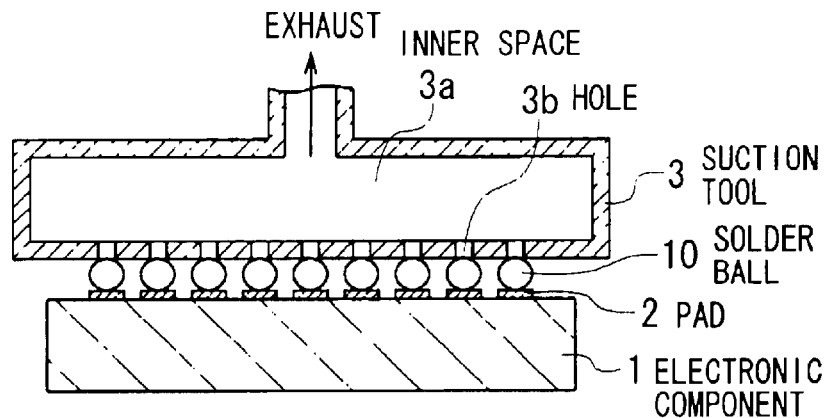
FIGS. 3A to 3D are schematic cross-sectional views showing the process steps of a method of mounting an electronic component/device on a PWB, in which the solder ball according to the first embodiment of FIG. 1 is used.
Figure 4A:
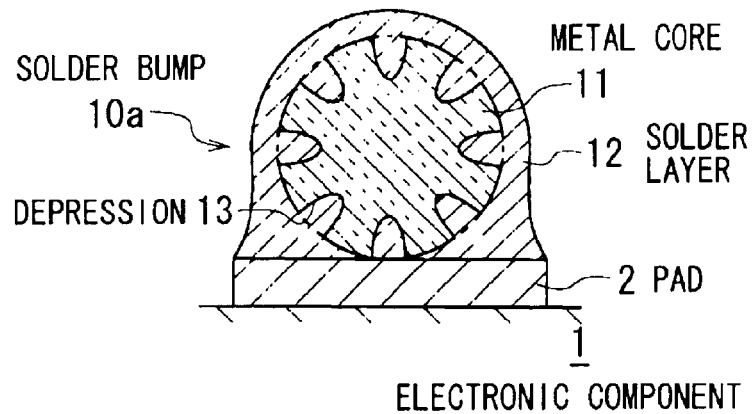
FIG. 4A is a schematic, enlarged cross-sectional view showing the internal structure of the solder bump and its vicinity in the process step of FIG. 3B.
Figure 4B:
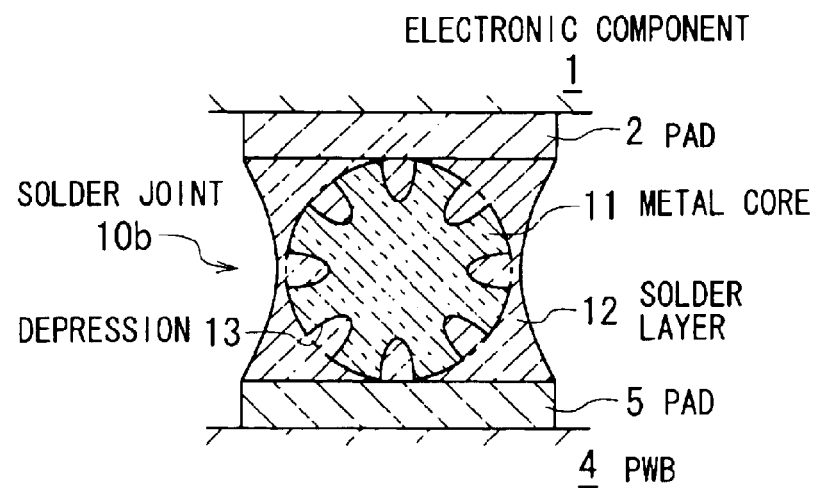
FIG. 4B is a schematic, enlarged cross-sectional view showing the internal structure of the solder bump and its vicinity in the process step of FIG. 3C, which shows the interconnection structure according to the first embodiment.

First, as shown in FIG. 3A, the solder balls 10 according to the first embodiment are placed on the respective pads 2 of the component 1 with a suction tool 3 and then, they are pressed on the pads 2 with a specific force. The suction tool 3 comprises an inner space 3a in its body and penetrating holes 3b formed to communicate with the space 3a at its bottom. The air existing in the space 3a is evacuated with a vacuum pump (not shown) or the like as an exhaust, and the space 3a is kept at a specific vacuum condition on operation. The holes 3b are arranged on the flat bottom of the tool 3 in such a way as to entirely overlap with the corresponding pads 2 of the component 1. The balls 10 are held at the mouths of the holes 3b by vacuum absorption and pressed onto the corresponding pads 2, as shown in FIG. 3A.

After the placement of the balls 10 on the corresponding pads 2 with the pressing force, the vacuum suction operation for the tool 3 is stopped and then, the tool 3 is separated from the balls 3. Thus, the balls 3 are left on the pads 2.

Figure 3B:
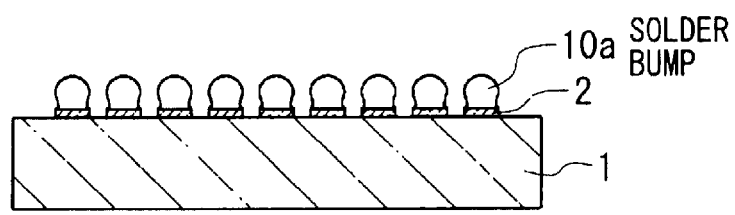

Next, the component 1 having the solder balls 10 on the pads 2 is placed in a known reflow furnace (not shown) and heated at a specific temperature for a specific period and then, it is taken out of the furnace for cooling. The specific temperature is chosen at a value higher than the melting temperature of the solder layer 12 and lower than the melting temperature of the core 11. Through these heating and cooling processes (i.e., the first reflowing process), only the solder layers 12 of the balls 10 on the pads 2 are temporarily melted by heat and solidified again. Thus, the solder layers 12 are fixed to the corresponding pads 2, resulting in solder bumps 10a fixed onto the respective pads 2, as shown in FIG. 3B. As clearly shown in FIG. 4A, each of the bumps 10a is approximately spherical, where the core is contacted with the pad 2 at its bottom.

Each of the solder bumps 10a thus formed comprises the metal core 11 therein and therefore, the mechanical strength of the bump 10a is enhanced. This means that the bumps 10a are prevented from being substantially deformed even if pressing force is repeatedly applied to the bumps 10a due to attachment and detachment of the testing sockets in desired operation tests for the component I. As a result, defective electrical interconnection between the pins of the sockets and the bumps 10a is surely prevented in the tests.

Subsequently, using a known mounting apparatus, the component 1 with the bumps 10a on the pads 2, which has been turned upside down, is positioned properly on a PWB 4 in such a way that the tops of the bumps 10a on the component 1 are contacted with the corresponding pads 5 on the PWB 4. The state at this stage is shown in FIG. 3C.

Figure 3C:
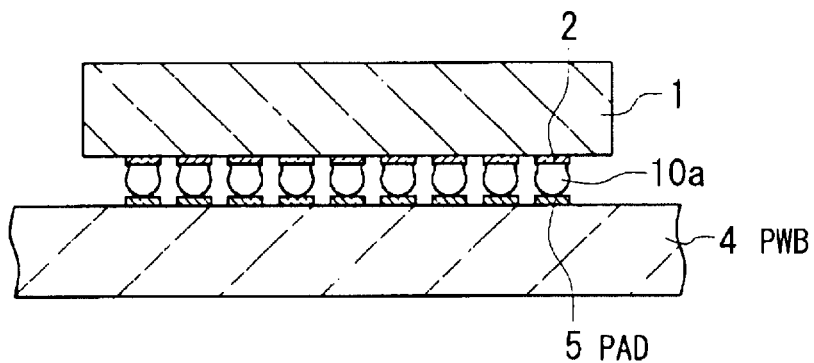
Figure 3D:
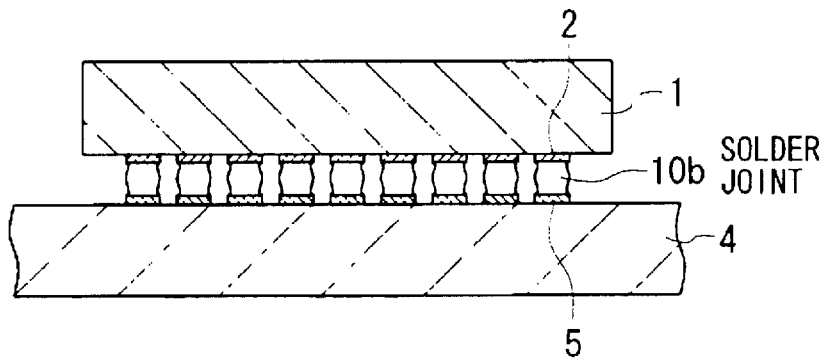

Thereafter, the combination of the component 1 and the PWB 4 shown in FIG. 3C is placed in a reflow furnace (not shown) and heated at a specific temperature for a specific period and then, it is taken out of the furnace for cooling. The specific temperature is chosen at the same value as chosen in the first reflowing process for forming the bumps 10a. Through these heating and cooling processes (i.e., the second reflowing process), the solder layers 12 of the bumps 10a on the pads 2 are temporarily melted by heat and solidified again. Thus, the solder layers 12 are fixed not only to the corresponding pads 2 on the component 1 but also the corresponding pads 5 on the PWB 4, resulting in solder joints 10b that interconnect the pads 2 with the pads 5, as shown in FIG. 3D.

The solder joints 10b constitute an interconnection structure for mechanically and electrically interconnecting the pads 2 and 5 with each other. The configuration of the joint 10b is clearly shown in FIG. 4B. As seen from FIG. 4B, the metal core 11 is contacted with the pad 2 at the top and the pad 5 at the bottom. Thus, the gap between the pad 2 and the PWB 4 (i.e., the height of the joint 10b) is determined by the diameter of the core 11.

In the interconnection structure obtained through the above-described processes, each of the solder joints 10b has the metal core 11 therein. Thus, the height of the joints 10b is kept uniformly over the whole surface of the component 1.

If some inconvenience or defect is found after the component 1 is mounted on the PWB 4 with the solder joints 10b, the cores 12 can be collected easily for reuse by selectively re-melting the solder layers 12 of the joints 10b. Therefore, by doing so, the fabrication cost of the solder balls 10, which has been raised by the use of the cores 12, is effectively suppressed.

With the solder ball 10 according to the first embodiment, as described above, the metal core 11 has the depressions 13 on its outer surface, and the solder layer 12 is formed to cover the whole outer surface of the core 11 in such a way as to fill all the depressions 13. Therefore, the volume of the solder layer 12 is larger than that of the above-described prior-art solder ball without depressions on the core by the total volume of the depressions 13. In other words, the quantity of the solder material is supplemented by the solder material filled in the depressions 13. Accordingly, even if the thickness of the solder layer 12 is not increased, a desired quantity of solder material for the solder joints 10b is obtainable easily.

Moreover, since the thickness of the solder layer 12 can be decreased according to the total volume of the depressions 13, the layer 12 is formed uniformly. This means that the volume of the layer 12 is restrained from fluctuating. Thus, a desired quantity of solder material for the solder joints 10b is obtainable stably even if the solder ball 10 is made smaller.

Furthermore, part of the solder layer 12 is filled into the depressions 13 of the core 11 and therefore, the adhesion strength of the layer 12 to the core 11 is enhanced.

With the interconnection structure according to the first embodiment, as shown in FIGS. 3D and 4B, each of the solder joints 10b is formed by melting and solidifying the solder ball 10 according to the first embodiment. Therefore, because of the same reason as described for the solder ball 10, even if the dimension of the solder ball 10 is reduced, a desired quantity of solder material for each of the joints 10b is obtainable easily.

Thus, even if the dimension of the solder ball 10 is reduced, the adhesion strength of the solder layer 12 to the pads 2 and 5 will not be insufficient. This means that sufficient adhesion strength is obtainable as desired. As a result, the mechanical and electrical interconnection reliability of the joints 10b is ensured as desired even if the electronic component 1 is mounted on the PWB 4 at a higher mounting or packaging density.

Second Embodiment

Figure 5:
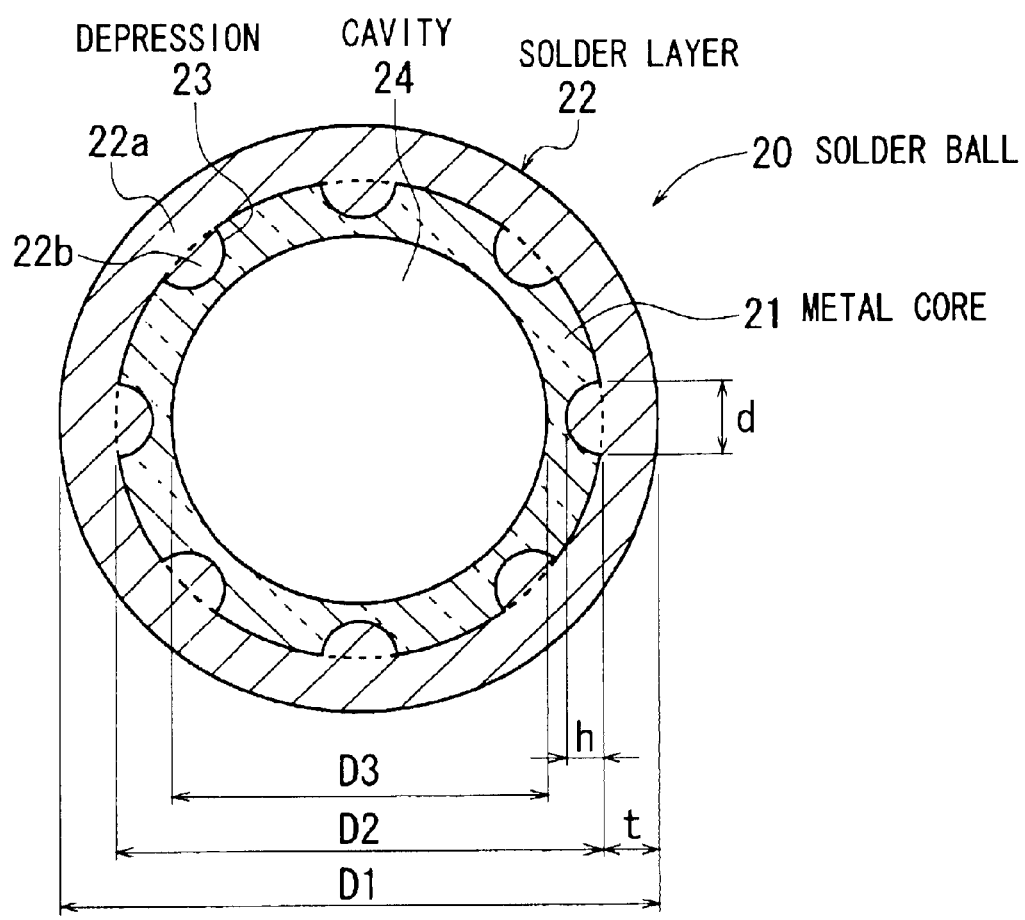
FIG. 5 is a schematic cross-sectional view showing the configuration of a solder ball according to a second embodiment of the invention, in which the core is hollow and shell-shaped.

FIG. 5 shows the configuration of a solder ball 20 according to a second embodiment of the invention.

As shown in FIG. 5, the solder ball 20 of the second embodiment comprises a hollow metal core 21 with an approximately spherical shape and a solder layer 22 formed on the outer surface of the core 21. The layer 22 covers the whole outer surface of the core 21. The core 21 has a spherical cavity 24 therein, which is concentric with the spherical outer surface of the core 21. Thus, the core 21 is like a spherical shell.

As seen from FIG. 5, the core 21 has depressions 23 on its outer surface. Each of these depressions 23 has a contour or profile obtained by cutting a sphere by a plane containing its axis. In other words, the contour of each of the depressions 23 is like a half of the sphere. Each depression 23 has an approximately circular opening or mouth on the outer surface of the core 21.

The mouth diameter d, the depth h, and the pitch p of the depressions 23 are determined in such a way that a desired quantity of solder material is supplied to a solder joint. This is the same as the solder ball 11 of the first embodiment. The depth h is smaller than the mouth diameter d in the second embodiment, as shown in FIG. 5 (i.e., h<d).

The material of the core 21 is a metal having a higher melting point than the solder material of the solder layer 22 and a wettability to the same solder material. This is the same as the first embodiment. In the second embodiment, copper or copper-nickel alloy is used for the material of the core 21.

The solder layer 22 covers the outer surface of the core 21 in such a way that the solder material of the layer 22 is filled into all the depressions 23. Therefore, the layer 22 is formed by a spherical shell part 22a and filling parts 22b placed in the respective depressions 23. The thickness t of the layer 22 is determined in such a way that the shell part 22a is formed on the whole outer surface of the core 21 approximately uniformly.

As the solder material of the solder layer 22, for example, Sn—Pb system solder, Bi—Sn system solder, or the like may be used. This is the same as the first embodiment.

The diameter D1 of the solder ball 20 is determined according to the dimension and pitch of the bonding pad of a mounting subject. According to the diameter D1 thus determined, the diameter D2 of the metal core 21 and the thickness t of the solder layer 22 are determined. The diameter D3 of the cavity 24 of the core 21 is determined in such a way that a desired mechanical strength is ensured in the core 21.

The hollow core 21 may be fabricated in various ways. For example, if the core 21 is made of Cu or Cu-based alloy, the following method (i) or (ii) is preferably used for this purpose.

(i) A metal plate, which is made of Cu or Cu-based alloy, is punched to thereby form a pair of metal pieces with a known press machine. Then, the pair of metal pieces is shaped into a pair of halves of the spherical core 21 with a known shaping machine. Each of the halves, which comprises the depressions 23 on its outer surface, has a shape obtainable by dividing the spherical core 21 into two equal parts by its vertical plane. Thereafter, the pair of halves is coupled with each other by a known method, thereby forming the hollow core 21.

(ii) A pair of halves of the spherical core 21 is formed by casting. Each of the halves, which comprises the depressions 23 on its outer surface, has a shape obtainable by dividing the spherical core 21 into two equal parts by its vertical plane. Thereafter, the pair of halves is coupled with each other by a known method, thereby forming the hollow core 21.

The solder layer 22 may be formed by plating or the like.

A method of mounting an electronic component/device on a PWB using the solder balls 20 according to the second embodiment is substantially the same as that of the first embodiment using the solder balls 10. Therefore, the explanation on this method is omitted here.

With the solder ball 20 according to the second embodiment, as described above, the hollow metal core 21 has the depressions 23 on its outer surface and the solder layer 22 is formed to cover the outer surface of the core 21 in such a way as to fill the depressions 23. Therefore, the same advantages as those of the solder ball 10 according to the first embodiment are obtainable.

Furthermore, the core 21 comprises the cavity 24 in its inside and therefore, there is an additional advantage that the weight of the core 21 can be lowered compared with the solid core 11 of the first embodiment.

Third Embodiment

Figure 6:
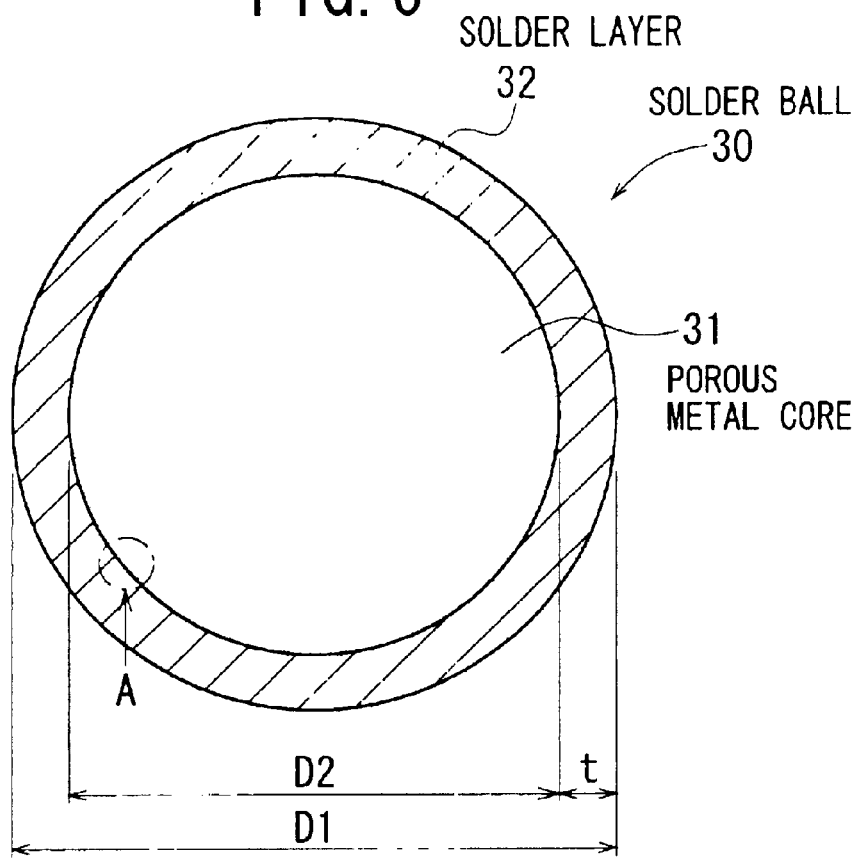
FIG. 6 is a schematic cross-sectional view showing the configuration of a solder ball according to a third embodiment of the invention, in which the core is porous.
Figure 7:
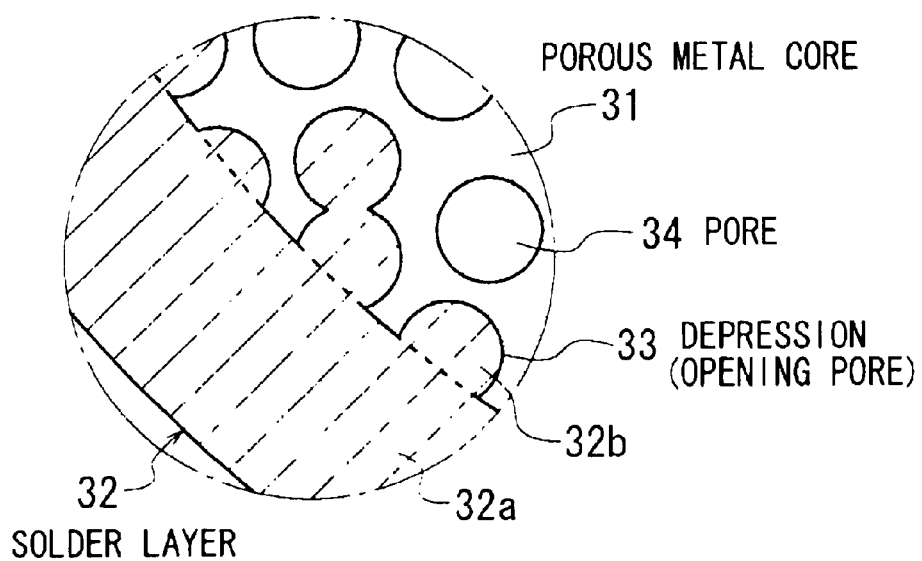
FIG. 7 is a schematic, enlarged cross-sectional view showing the inner configuration of the area A in FIG. 6.

FIG. 6 shows the configuration of a solder ball 30 according to a third embodiment of the invention. FIG. 7 shows the detailed structure in the area A of the ball 30 in FIG. 6.

As shown in FIG. 6, the solder ball 30 of the third embodiment comprises a porous metal core 31 with an approximately spherical shape and a solder layer 32 formed on the outer surface of the core 31. The layer 32 covers the whole outer surface of the core 31.

As seen from FIG. 7, the core 31 has many pores 34 in its inside. Part of the pores 34 existing in the vicinity of the outer surface of the core 31 reach the outer surface, resulting in opening pores. These opening pores 34 constitute depressions 33, in other words, the opening pores 34 are used as the depressions 33. The depressions 33 are irregularly arranged over the whole outer surface of the core 31.

The material of the core 31 is a metal having a higher melting point than the solder material of the solder layer 32 and a wettability to the same solder material. This is the same as the first embodiment. In the third embodiment, copper is used for the material of the core 31. Since the core 31 is porous, the core 31 is made of "sponge copper", i.e., a copper material with a sponge-like structure. However, any other sponge metal than sponge copper may be used for this purpose.

The solder layer 32 covers the outer surface of the core 31 in such a way that the solder material of the layer 32 is filled into all the depressions 33. Therefore, the layer 32 is formed by a spherical shell part 32a and filling parts 32b placed in the respective depressions 33. The thickness t of the layer 32 is determined in such a way that the shell part 32a is formed over the whole outer surface of the core 31 approximately uniformly.

The diameter D1 of the solder ball 30 is determined according to the dimension and pitch of the bonding pad of a mounting subject. According to the diameter D1 thus determined, the diameter D2 of the metal core 31 and the thickness t of the solder layer 32 are determined.

The porous metal core 31 may be fabricated in various ways. For example, if the core 31 is made of Cu or Cu-based alloy, casting is preferably used. The solder layer 32 may be fabricated by plating or the like.

A method of mounting electronic a component/device on a PWB using the solder balls 30 according to the third embodiment is substantially the same as that of the first embodiment using the solder balls 10. Therefore, the explanation on this is omitted here.

With the solder ball 30 according to the third embodiment, as described above, the porous metal core 31 has the depressions 33 (which are formed by the opening pores 34) on its outer surface, and the solder layer 32 is formed to cover the outer surface of the core 31 in such a way as to fill the depressions 33. Therefore, the same advantages as those of the solder ball 10 according to the first embodiment are obtainable.

Furthermore, since the core 31 is porous, the step of forming the depressions 13 or 23 in the first or second embodiment is unnecessary. Thus, there is an additional advantage that the solder ball 30 can be fabricated easily compared with the solder nails 10 and 20 according to the first and second embodiments.

Variations

Needless to say, the present invention is not limited to the above-described first to third embodiments, because they are preferred examples of the invention. Any change or modification may be added to them within the spirit of the invention.

For example, in the above-described first and second embodiments, the depressions 13 and 23 of the metal cores 11 and 21 have a shape of a half of an ellipsoid or sphere.

However, the contour or shape of the depressions may be set optionally. For example, the depressions may be cylindrical, conical, pyramidal, and so on.

In the first to third embodiments, the contours of the metal cores 11, 21, and 31 are spherical. However, they may be in any other shape than spherical.

In the first and second embodiments, the solder balls 10 and 20 comprise the metal cores 11 and 21, respectively. However, the invention is not limited to these examples. The material of the core maybe ceramic, synthetic resin, the combination of ceramic and metal, or the combination of synthetic resin and metal.

In the first embodiment, the solder ball 10 according to the invention is used for mounting the electronic component 1 on the PWB 4. However, the invention is not limited to this. The invention is applicable to any other cases where (i) an electronic component(s) and/or device(s) is/are mounted on a substrate, (ii) a functional module(s) in which many electronic components and/or circuits are integrated is/are mounted on a substrate, and (iii) an electronic component(s) and/or device(s) and/or a functional module(s) are mounted on any other component, device, or module.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A solder ball comprising:

a conductive core having depressions on its outer surface; and a solder layer formed to cover the outer surface of the core in such a way as to fill the depressions of the core.

2. The ball according to claim 1, wherein the core has a higher melting point than the solder layer;

and wherein the core has wettability to the solder layer.

3. The ball according to claim 1, wherein the core has a cavity in its inside.

4. The ball according to claim 3, wherein the depressions do not reach the cavity.

5. The ball according to claim 3, wherein the core is shell-shaped by the cavity.

6. The ball according to claim 3, wherein the core and the cavity are spherical and concentric with each other;

and wherein the core is shell-shaped.

7. The ball according to claim 1, wherein the depressions are directed from the outer surface of the core to approximately a center thereof.

8. The ball according to claim 1, wherein each of the depressions has a depth larger than a diameter of a mouth thereof.

9. The ball according to claim 3, wherein each of the depressions has a depth smaller than a diameter of a mouth thereof.

10. The ball according to claim 1, wherein the core is made of a porous metal body having pores;

and wherein part of the pores reaches the outer surface of the core, forming the depressions.

11. An interconnection structure designed for mechanically and electrically interconnecting a first electrode formed on a first member with an opposing second electrode formed on a second member with a conductive joint;

wherein the joint is formed by melting and solidifying a solder ball;

and wherein the solder ball comprises a conductive core having depressions on its outer surface, and a solder layer formed to cover the outer surface of the core in such a way as to fill the depressions of the core.

12. The structure according to claim 11, wherein the core has a higher melting point than the solder layer;

and wherein the core has wettability to the solder layer.

13. The structure according to claim 11, wherein the core has a cavity in its inside.

14. The structure according to claim 13, wherein the depressions do not reach the cavity.

15. The structure according to claim 13, wherein the core is shell-shaped by the cavity.

16. The structure according to claim 13, wherein the core and the cavity are spherical and concentric with each other;

and wherein the core is shell-shaped.

17. The structure according to claim 11, wherein the depressions are directed from the outer surface of the core to approximately a center thereof.

18. The structure according to claim 11, wherein each of the depressions has a depth larger than a diameter of a mouth thereof.

19. The structure according to claim 13, wherein each of the depressions has a depth smaller than a diameter of a mouth thereof.

20. The structure according to claim 11, wherein the core is made of a porous metal body having pores;

and wherein a part of the pores reaches the outer surface of the core, forming the depressions.

* * * * *